(12) United States Patent
Tanaka et al.

(10) Patent No.: US 6,722,953 B2
(45) Date of Patent: Apr. 20, 2004

(54) ABRASIVE LIQUID FEED APPARATUS, METHOD FOR FEEDING ADDITIVE TO ABRASIVE LIQUID FEED APPARATUS, AND POLISHING APPARATUS

(75) Inventors: Takashi Tanaka, Kanagawa (JP); Takashi Tsuzuki, Tokyo (JP); Fujihiko Toyomasu, Kanagawa (JP)

(73) Assignee: Ebara Corporation, Tokyo (JP)

( * ) Notice: Subject to any disclaimer, the term of this patent is extended or adjusted under 35 U.S.C. 154(b) by 15 days.

(21) Appl. No.: 10/013,670

(22) Filed: Dec. 13, 2001

(65) Prior Publication Data

US 2002/0072310 A1 Jun. 13, 2002

(30) Foreign Application Priority Data

Dec. 13, 2000 (JP) .......................................... 2000-378849

(51) Int. Cl.$^7$ ................................................. B24B 1/00
(52) U.S. Cl. .............................. 451/41; 451/60; 451/30; 451/87; 451/446
(58) Field of Search .............................. 451/41, 60, 87, 451/446, 36

(56) References Cited

U.S. PATENT DOCUMENTS

| | | | |
|---|---|---|---|
| 5,643,058 A | * | 7/1997 | Erichsen et al. ............... 451/99 |
| 6,338,671 B1 | * | 1/2002 | Kawashima et al. .......... 451/87 |
| 6,358,125 B2 | * | 3/2002 | Kawashima et al. .......... 451/60 |
| 6,461,524 B1 | * | 10/2002 | Tsuihiji et al. ............... 210/777 |
| 6,464,564 B2 | * | 10/2002 | Sandhu et al. ................. 451/7 |

\* cited by examiner

Primary Examiner—Joseph J. Hail, III
Assistant Examiner—Alvin J. Grant
(74) Attorney, Agent, or Firm—Wenderoth, Lind & Ponack, L.L.P.

(57) ABSTRACT

An abrasive liquid feed apparatus comprises a supply tank for storing an abrasive liquid having a predetermined concentration, an abrasive liquid pipe for transferring the abrasive liquid from the tank to a polishing means and an additive feed means which feeds an additive having a predetermined concentration to the tank. It further comprises an additive concentration measurement means which measures a concentration of the additive in the abrasive liquid in the supply tank, a measurement means which measures an amount of the abrasive liquid in the tank and a control which calculates an amount of the additive to be supplemented to the tank, based on the concentration of the additive measured by the additive concentration measurement means and the amount of the abrasive liquid measured by the metering means. To maintain the concentration of aqueous hydrogen peroxide in the abrasive liquid.

12 Claims, 4 Drawing Sheets

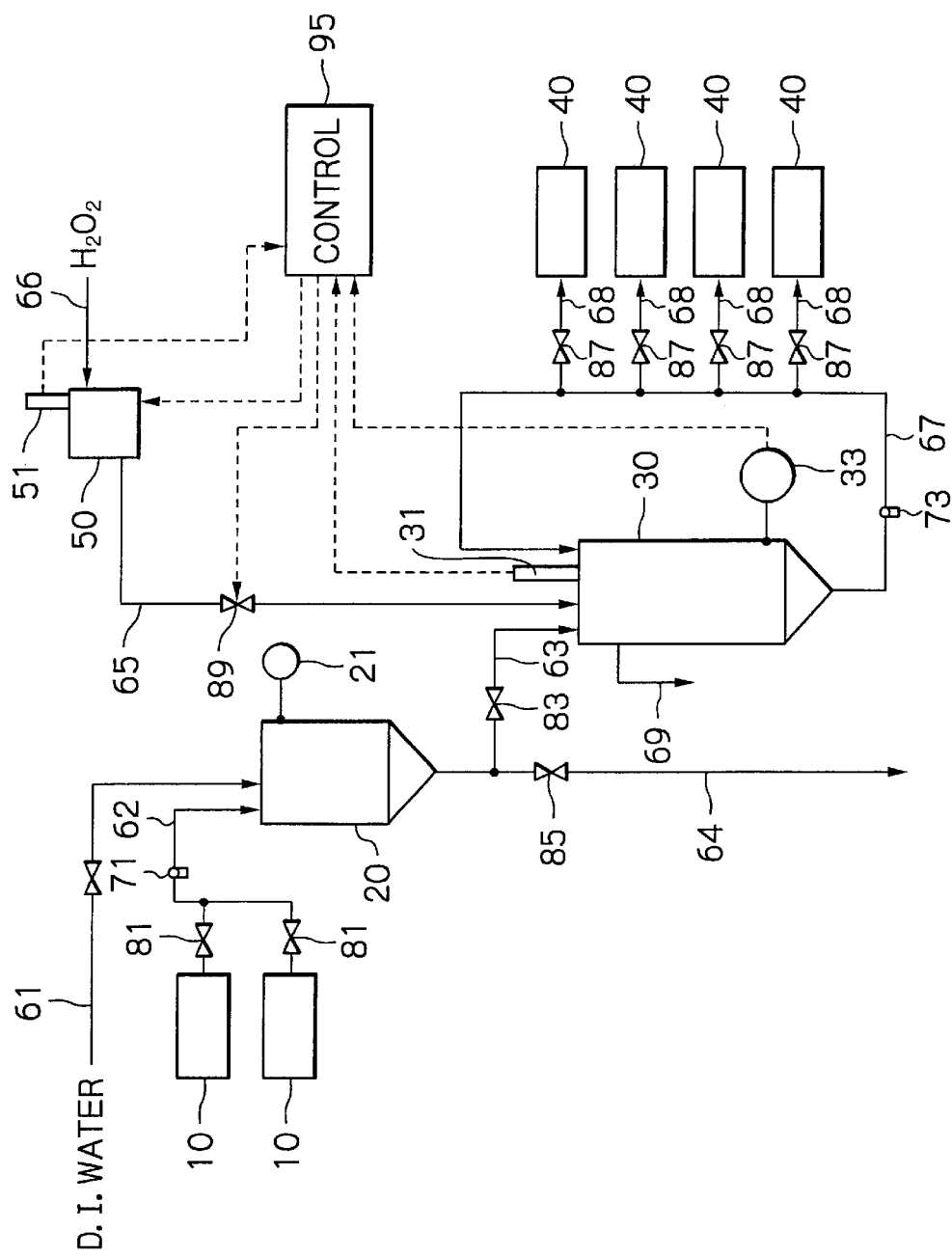

Fig. 2

| RESIDUAL AMOUNT (L) OF ABRASIVE LIQUID IN TANK | 10 | 20 | 30 | 40 | 50 | 60 | 70 | 80 | 90 | 100 |
|---|---|---|---|---|---|---|---|---|---|---|
| $H_2O_2$ CONCENTRATION (wt%) OF ABRASIVE LIQUID IN TANK | 1.7 | 1.7 | 1.7 | 1.7 | 1.7 | 1.7 | 1.7 | 1.7 | 1.7 | 1.7 |
| $H_2O_2$ CONCENTRATION (wt%) AFTER $H_2O_2$ IS ADDED (1 METER UNIT) | 1,982 | 1,842 | 1,795 | 1,771 | 1,757 | 1,747 | 1,741 | 1,736 | 1,732 | 1,728 |
| RATE (%) OF INCREASE IN $H_2O_2$ CONCENTRATION (1 METER UNIT) | 16,570 | 8,327 | 5,560 | 4,174 | 3,341 | 2,785 | 2,388 | 2,089 | 1,858 | 1,672 |
| $H_2O_2$ CONCENTRATION (wt%) AFTER $H_2O_2$ IS ADDED (2 METER UNITS) | 2,258 | 1,982 | 1,888 | 1,842 | 1,813 | 1,795 | 1,781 | 1,771 | 1,763 | 1,757 |
| RATE (%) OF INCREASE IN $H_2O_2$ CONCENTRATION (2 METER UNITS) | 32,814 | 16,570 | 11,084 | 8,327 | 6,668 | 5,560 | 4,768 | 4,174 | 3,711 | 3,341 |
| $H_2O_2$ CONCENTRATION (wt%) AFTER $H_2O_2$ IS ADDED (3 METER UNITS) | 2,529 | 2,120 | 1,982 | 1,912 | 1,870 | 1,842 | 1,821 | 1,806 | 1,795 | 1,785 |
| RATE (%) OF INCREASE IN $H_2O_2$ CONCENTRATION (3 METER UNITS) | 48,740 | 24,732 | 16,570 | 12,459 | 9,982 | 8,327 | 7,142 | 6,253 | 5,560 | 5,006 |
| $H_2O_2$ CONCENTRATION (wt%) AFTER $H_2O_2$ IS ADDED (4 METER UNITS) | 2,794 | 2,258 | 2,074 | 1,982 | 1,926 | 1,888 | 1,862 | 1,842 | 1,826 | 1,813 |
| RATE (%) OF INCREASE IN $H_2O_2$ CONCENTRATION (4 METER UNITS) | 64,359 | 32,814 | 22,020 | 16,570 | 13,283 | 11,084 | 9,509 | 8,327 | 7,405 | 6,668 |
| $H_2O_2$ CONCENTRATION (wt%) AFTER $H_2O_2$ IS ADDED (5 METER UNITS) | 3,055 | 2,394 | 2,166 | 2,051 | 1,982 | 1,935 | 1,902 | 1,877 | 1,857 | 1,842 |
| RATE (%) OF INCREASE IN $H_2O_2$ CONCENTRATION (5 METER UNITS) | 79,678 | 40,816 | 27,435 | 20,661 | 16,570 | 13,831 | 11,870 | 10,395 | 9,247 | 8,327 |
| $H_2O_2$ CONCENTRATION (wt%) AFTER $H_2O_2$ IS ADDED (6 METER UNITS) | 3,310 | 2,529 | 2,258 | 2,120 | 2,037 | 1,982 | 1,942 | 1,912 | 1,888 | 1,870 |
| RATE (%) OF INCREASE IN $H_2O_2$ CONCENTRATION (6 METER UNITS) | 94,707 | 48,740 | 32,814 | 24,732 | 19,845 | 16,570 | 14,223 | 12,459 | 11,084 | 9,982 |
| $H_2O_2$ CONCENTRATION (wt%) AFTER $H_2O_2$ IS ADDED (7 METER UNITS) | 3,561 | 2,662 | 2,349 | 2,189 | 2,093 | 2,028 | 1,982 | 1,947 | 1,920 | 1,898 |
| RATE (%) OF INCREASE IN $H_2O_2$ CONCENTRATION (7 METER UNITS) | 109,454 | 56,587 | 38,157 | 28,783 | 23,106 | 19,300 | 16,570 | 14,517 | 12,916 | 11,634 |
| $H_2O_2$ CONCENTRATION (wt%) AFTER $H_2O_2$ IS ADDED (8 METER UNITS) | 3,807 | 2,794 | 2,439 | 2,258 | 2,148 | 2,074 | 2,021 | 1,982 | 1,951 | 1,926 |
| RATE (%) OF INCREASE IN $H_2O_2$ CONCENTRATION (8 METER UNITS) | 123,926 | 64,359 | 43,466 | 32,814 | 26,355 | 22,020 | 18,910 | 16,570 | 14,745 | 13,283 |
| $H_2O_2$ CONCENTRATION (wt%) AFTER $H_2O_2$ IS ADDED (9 METER UNITS) | 4,048 | 2,925 | 2,529 | 2,326 | 2,203 | 2,120 | 2,061 | 2,017 | 1,982 | 1,954 |
| RATE (%) OF INCREASE IN $H_2O_2$ CONCENTRATION (9 METER UNITS) | 138,132 | 72,055 | 48,740 | 36,825 | 29,591 | 24,732 | 21,244 | 18,618 | 16,570 | 14,928 |
| $H_2O_2$ CONCENTRATION (wt%) AFTER $H_2O_2$ IS ADDED (10 METER UNITS) | 4,285 | 3,055 | 2,618 | 2,394 | 2,258 | 2,166 | 2,101 | 2,051 | 2,013 | 1,982 |
| RATE (%) OF INCREASE IN $H_2O_2$ CONCENTRATION (10 METER UNITS) | 152,078 | 79,678 | 53,980 | 40,816 | 32,814 | 27,435 | 23,571 | 20,661 | 18,391 | 16,570 |

* RAW $H_2O_2$ IS ADDED TO A SLURRY IN THE SUPPLY TANK, WHEREIN THE SLURRY HAS AN $H_2O_2$ CONCENTRATION OF 1.7 wt%.
*1 METER UNIT MEANS 92.5 mL OF $H_2O_2$ ADDED TO THE SUPPLY TANK.
* CONCENTRATION OF RAW $H_2O_2$ TO BE ADDED TO A SUPPLY TANK : 30 wt%

ABRASIVE LIQUID FEED APPARATUS, METHOD FOR FEEDING ADDITIVE TO ABRASIVE LIQUID FEED APPARATUS, AND POLISHING APPARATUS

BACKGROUND OF THE INVENTION

The present invention relates to an abrasive liquid feed apparatus used in a polishing apparatus. More specifically, the present invention relates to an abrasive liquid feed apparatus capable of feeding an abrasive liquid which contains in stable form an additive, such as aqueous hydrogen peroxide. The present invention also relates to a method for feeding an additive to an abrasive liquid feed apparatus, and a polishing apparatus.

With recent rapid progress in technology for fabricating high-integration semiconductor devices, circuit wiring patterns have been becoming increasingly fine and, as a result, spaces between wiring patterns have also been decreasing. As wiring spacing decreases to less than 0.5 microns, the depth of focus in circuit pattern formation in photolithography and the like becomes shallower. Accordingly, surfaces of semiconductor wafers on which circuit pattern images are to be formed by a stepper are required to be polished by a polishing apparatus to an exceptionally high degree of surface flatness. To accomplish such a high degree of surface flatness, it has become common to use a polishing apparatus.

FIG. 4 shows an example of a main part of a polishing unit of the polishing apparatus. The polishing unit comprises a turntable 142 having a polishing cloth (polishing member) 140 adhered to an upper surface thereof, a wafer holder 144 for holding a semiconductor wafer W as an object to be polished, in a manner such that the wafer W is capable of being rotated and pressed against the polishing cloth, and an abrasive liquid feed nozzle 146 for feeding an abrasive liquid Q onto the polishing cloth 140. The wafer holder 144 is connected to a wafer holder shaft 148 and supported in a manner such that it is capable of being vertically moved by an air cylinder (not shown).

The wafer holder 144 has an elastic mat 150 made of, for example, polyurethane, attached on a lower surface thereof. The semiconductor wafer W is adapted to be held by the wafer holder 144, while it makes intimate contact with the elastic mat 150. Further, a cylindrical guide ring 152 is provided at an outer peripheral portion of the wafer holder 144, so as to prevent displacement of the semiconductor wafer W from the lower surface of the wafer holder 144 during a polishing operation. The cylindrical guide ring 152 is fixed to the wafer holder 144. A lower end face of the guide ring 152 projects beyond the lower holding surface of the wafer holder 144. The semiconductor wafer W is held in a recess formed inside the projecting portion of the cylindrical guide ring 152.

With this arrangement, the semiconductor wafer W is held on the elastic mat 150 attached on the lower surface of the wafer holder 144 and, while the wafer holder 144 presses the wafer W against the polishing cloth 140 on the turntable 142, the turntable 142 and the wafer holder 144 are rotated, so as to effect relative movement between the polishing cloth 140 and the semiconductor wafer W, to thereby conduct polishing. During polishing, the abrasive liquid Q is fed from the abrasive liquid feed nozzle 146 onto the polishing cloth 140. As the abrasive liquid, use is made of, for example, a slurry obtained by suspending fine abrasive particles in an alkali solution. Thus, chemical polishing is effected by an alkali solution, and mechanical polishing by abrasive particles.

In order to conduct polishing to a desired extent by using the above-mentioned polishing apparatus, the abrasive liquid is required to be fed to the polishing unit in a stable manner, at a predetermined concentration and at a predetermined feed rate. A system for feeding an abrasive liquid comprises: a crude liquid tank in which a crude liquid in the form of a mixture of powdery silica and, KOH or $NH_4OH$ is stored; an adjusting tank for preparing an abrasive liquid having a predetermined concentration by diluting the crude liquid with D.I. (De-ionized) water or a chemical liquid; a supply tank in which the abrasive liquid prepared in the adjusting tank is temporarily stored before the abrasive liquid is fed to the abrasive liquid feed nozzle 146 of the polishing unit; and abrasive liquid feed pipes provided between the tanks and between the supply tank and the abrasive liquid feed nozzle 146 of the polishing unit.

In order to modify a wafer surface to be polished, an additive, such as an oxidant, is added to the abrasive liquid. Illustratively stated, in order to oxidize a metallic film made of copper or tungsten formed on the semiconductor wafer W, an oxidant such as $H_2O_2$ (aqueous hydrogen peroxide) is added to the abrasive liquid.

When aqueous hydrogen peroxide is added to the abrasive liquid, the polishing rate of a wafer varies, depending on the concentration of aqueous hydrogen peroxide in the abrasive liquid (when the concentration of aqueous hydrogen peroxide is low, the polishing rate is low). However, the concentration of aqueous hydrogen peroxide in the abrasive liquid inevitably decreases, due to decomposition of aqueous hydrogen peroxide over time. Further, since an amount of an additive to be used is small, feeding of the additive must be highly accurate. Therefore, in order to maintain a polishing rate at a predetermined level, a concentration of an additive, such as aqueous hydrogen peroxide, in the abrasive liquid must be detected during a polishing operation, and maintained accurately at a predetermined level.

In view of these requirements, the present invention has been made. It is an object of the present invention to provide an abrasive liquid feed apparatus, a method for feeding an additive to an abrasive feed apparatus, and a polishing apparatus, in which the concentration of an additive (such as aqueous hydrogen peroxide) in an abrasive liquid can be automatically detected during a polishing operation and maintained accurately at a predetermined level.

SUMMARY OF THE INVENTION

The present invention provides an abrasive liquid feed apparatus comprising: a supply tank for storing an abrasive liquid having a predetermined concentration; an additive feed means which feeds an additive to the supply tank; an additive concentration measurement means which measures a concentration of the additive in the abrasive liquid in the supply tank; and a control means which controls the concentration of the additive. When the concentration of the additive measured by the additive concentration measurement means decreases to a first concentration value outside a predetermined range, the control means enables the additive to be fed to the supply tank, to thereby increase the concentration of the additive to a second concentration value within the predetermined range.

The above-mentioned abrasive liquid feed apparatus may further comprise a metering means which measures an amount of the abrasive liquid in the supply tank, and the control means may increase the concentration of the additive from the first concentration value to the second concentration value by calculating an amount of the additive to be fed to the supply tank, based on the concentration of the additive measured by the additive concentration measurement means and the amount of the abrasive liquid measured by the metering means, and enabling the additive in the calculated amount to be fed to the supply tank using the additive feed means.

In the present invention, the additive may be fed to the supply tank in predetermined meter units.

The present invention also provides a method for feeding an additive to an abrasive liquid feed apparatus, which abrasive liquid feed apparatus comprises a supply tank for storing an abrasive liquid having a predetermined concentration, and an additive feed means which feeds an additive to the supply tank. The method comprises the steps of:

measuring a concentration of the additive in the abrasive liquid in the supply tank; and calculating an amount of the additive to be fed to the supply tank when the concentration of the additive in the abrasive liquid in the supply tank decreases to a first concentration value outside a predetermined range, and feeding the additive in the calculated amount to the supply tank, to thereby increase the concentration of the additive in the abrasive liquid in the supply tank to a second concentration value within the predetermined range.

The above-mentioned method may be carried out such that when the concentration of the additive in the abrasive liquid in the supply tank decreases to the first concentration value, the amount of the additive to be fed to the supply tank is calculated from a residual amount of the abrasive liquid in the supply tank and the concentration of the additive in the abrasive liquid in the supply tank.

The present invention further provides a polishing apparatus comprising a polishing means and the above-mentioned abrasive liquid feed apparatus. The polishing means conducts polishing by holding and pressing an object to be polished against a polishing member, while feeding an abrasive liquid to the polishing member.

BRIEF DESCRIPTION OF THE DRAWINGS

FIG. 1 is a system diagram showing an abrasive liquid feed apparatus according to an embodiment of the present invention.

FIG. 2 shows a table which indicates the concentration of aqueous hydrogen peroxide in an abrasive liquid in a supply tank and the rate of increase in the concentration of aqueous hydrogen peroxide in the abrasive liquid after aqueous hydrogen peroxide is fed to the supply tank in predetermined meter units.

DETAILED DESCRIPTION OF THE INVENTION

Figure 3:
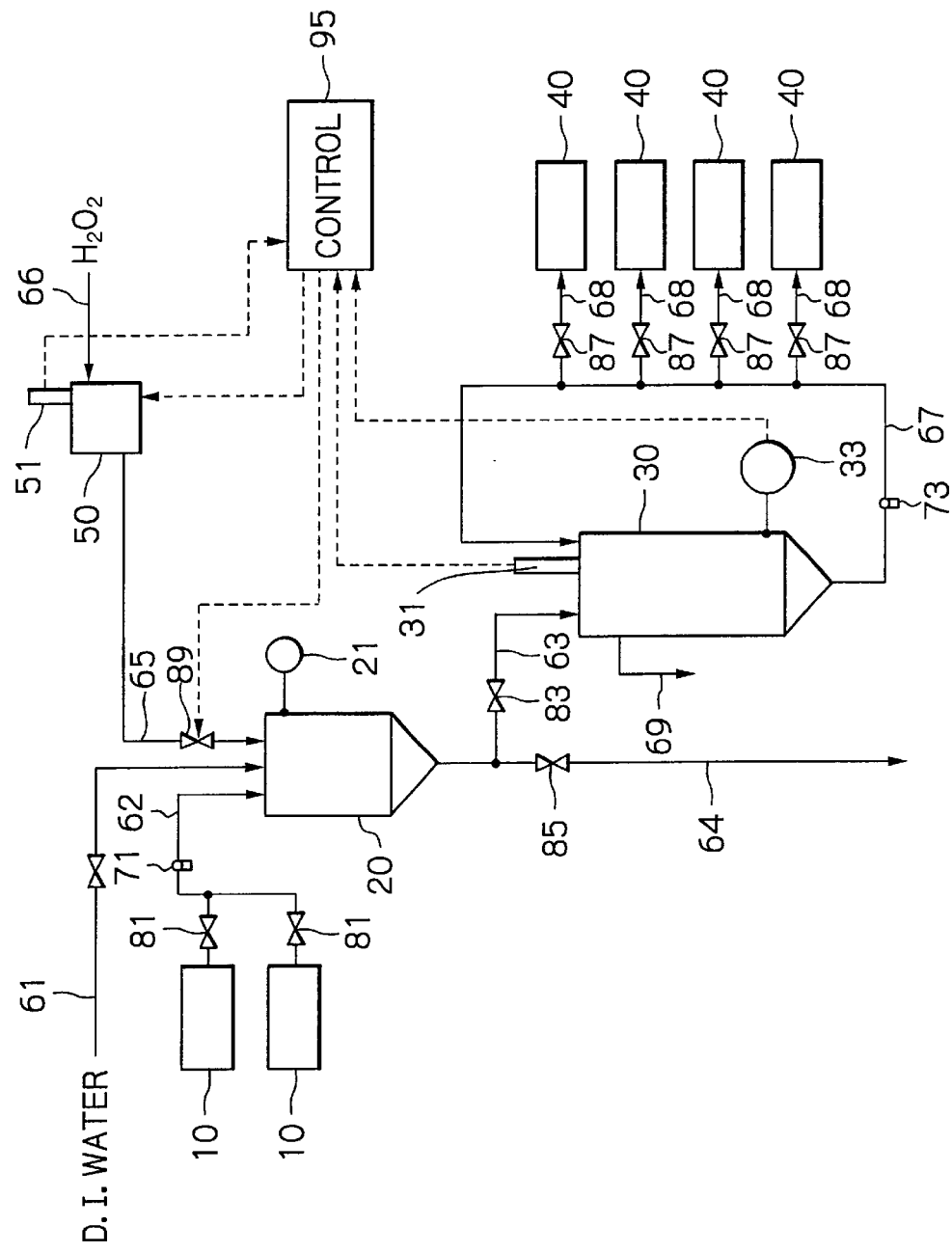
FIG. 3 is a system diagram of an abrasive liquid feed apparatus according to another embodiment of the present invention.

Hereinbelow, description is made in detail with regard to embodiments of the present invention, referring to the accompanying drawings.

FIG. 1 is a system diagram showing an abrasive liquid feed apparatus in an embodiment of the present invention. As shown in FIG. 1, the abrasive liquid feed apparatus comprises a plurality of (two in this embodiment) crude liquid tanks 10 containing a crude abrasive liquid (hereinafter, referred to simply as "crude liquid"), an adjusting tank 20 for preparing an abrasive liquid having a predetermined concentration by diluting the crude liquid with D.I. water or a chemical liquid, a supply tank 30 in which the abrasive liquid prepared in the adjusting tank 20 is temporarily stored before the abrasive liquid is fed to polishing units 40, and an aqueous hydrogen peroxide metering tank 50 in which aqueous hydrogen peroxide as an additive is temporarily stored before being fed to the supply tank 30 in predetermined meter units in a manner described later.

A D.I. water line 61 is connected to the adjusting tank 20. The crude liquid tanks 10 and the adjusting tank 20 are connected by a crude liquid pipe 62 having a crude liquid pump 71 provided therein. A valve 81 is provided in an outlet-side pipe of each crude liquid tank 10. The adjusting tank 20 and the supply tank 30 are connected by a liquid transfer pipe 63 having a valve 83 provided therein. A discharge pipe 64 is connected to the adjusting tank 20 and branched off from the liquid transfer pipe 63. A discharge valve 85 is provided in the discharge pipe 64. The discharge pipe 64 and the discharge valve 85 are used for, for example, discharging a cleaning liquid when the adjusting tank 20 is cleaned. Reference numeral 21 denotes a liquid level sensor (a sensor for measuring the amount of crude liquid or D.I. water).

Figure 4:
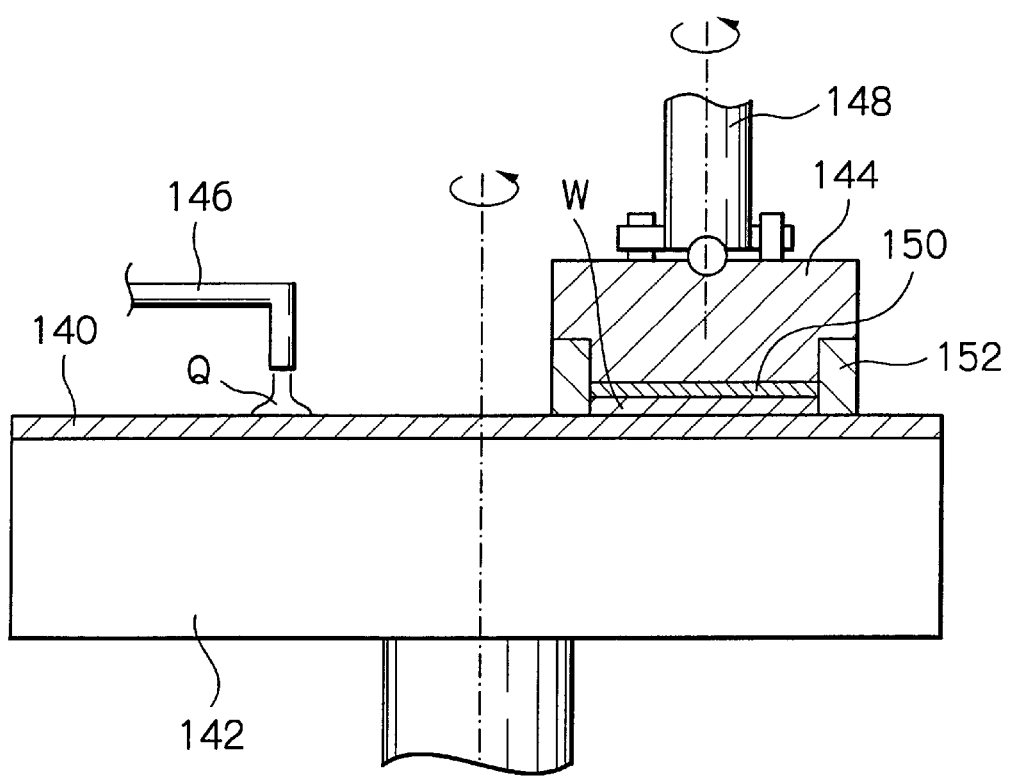
FIG. 4 is a diagram showing an example of a main part of a polishing unit.

An aqueous hydrogen peroxide feed pipe 65 extending from the aqueous hydrogen peroxide metering tank 50 is connected to the supply tank 30. A valve 89 is connected to the aqueous hydrogen peroxide feed pipe 65, and an aqueous hydrogen peroxide feed line 66 is connected to the aqueous hydrogen peroxide metering tank 50. An abrasive liquid pipe 67 having an abrasive liquid pump 73 provided therein is connected to an outlet side of the supply tank 30. The abrasive liquid pipe 67 is a circulation pipe returning to the supply tank 30. A plurality of (four in this embodiment) pipes 68 are branched off from the abrasive liquid pipe 67 and connected to the abrasive liquid feed nozzles 146 (see FIG. 4) of the polishing units 40 through valves 87. A liquid level sensor 31 for measuring the level of the surface of abrasive liquid in the supply tank 30 is provided at an upper portion of the supply tank 30. A concentration meter 33 which measures the concentration of aqueous hydrogen peroxide in the abrasive liquid is provided at a lower lateral side of the supply tank 30. As the concentration meter 33, for example, a concentration meter utilizing ultrasonic waves is used. Further, an overflow pipe 69 is connected to the supply tank 30.

The aqueous hydrogen peroxide is fed through the aqueous hydrogen peroxide feed line 66 to the aqueous hydrogen peroxide metering tank 50. By using a liquid level sensor 51 provided at an upper portion of the aqueous hydrogen peroxide metering tank 50, the level of the liquid surface of the aqueous hydrogen peroxide in the metering tank 50 is measured. Thus, the aqueous hydrogen peroxide to be fed to the supply tank 30 is metered and fed to the supply tank 30 in predetermined meter units.

An output of each of the liquid level sensor 31 and the concentration meter 33 is input to a control means 95. In accordance with a signal emitted from the liquid level sensor 31, the control means 95 calculates the residual amount of abrasive liquid in the supply tank 30, and calculates the amount of aqueous hydrogen peroxide to be fed to the supply tank 30 (hereinafter, frequently referred to simply as "the feed amount of aqueous hydrogen peroxide") in a method described later. Then, the control means 95 controls the aqueous hydrogen peroxide metering tank 50 and the valve 89 so as to feed the aqueous hydrogen peroxide in the calculated amount. In actuality, the control means 95 controllably operates various valves and pumps other than the valve 89, to thereby control an operation of the entire abrasive liquid feed apparatus.

An arrangement of the polishing unit 40 in this embodiment is the same as that of the polishing unit described above referring to FIG. 4.

Next, description is made with regard to the operation of the abrasive liquid feed apparatus. First, one of the valves 81 is opened and the crude liquid pump 71 is operated, to thereby transfer the crude liquid from one of the crude liquid tanks 10 to the adjusting tank 20. At the same time, the crude liquid is diluted with D.I. water fed through the D.I. water line 61 to the adjusting tank 20, to thereby obtain an abrasive liquid having a predetermined concentration. The reason why a plurality of crude liquid tanks 10 are used is that the abrasive liquid can be continuously fed to the polishing units 40, even when one of the crude liquid tanks 10 becomes empty.

The abrasive liquid thus obtained in the adjusting tank 20 is fed through the liquid transfer pipe 63 to the supply tank 30 for storage, by opening the valve 83. The abrasive liquid stored in the supply tank 30 is circulated through the abrasive liquid pipe 67, in accordance with operation of the abrasive liquid feed pump 73. When a polishing operation is conducted by one of the polishing units 40, the valve 87 corresponding to that polishing unit 40 is opened, so as to feed the abrasive liquid from the abrasive liquid feed nozzle 146 (shown in FIG. 4) of the polishing unit 40 onto the polishing cloth 140.

The method for feeding the aqueous hydrogen peroxide to the supply tank 30 is as follows. When the residual amount of abrasive liquid in the supply tank 30, which is read by the liquid level sensor 31, becomes 10 L, 20 L, 30 L, . . . (that is, for every 10 L of the residual amount of abrasive liquid), the concentration of aqueous hydrogen peroxide in the abrasive liquid in the supply tank 30 (hereinafter, frequently referred to simply as "the concentration of aqueous hydrogen peroxide") is measured by the concentration meter 33. In this embodiment, a predetermined range of the concentration of aqueous hydrogen peroxide is from 1.7 to 2.0 wt %. Therefore, the control means 95 judges whether or not a value of measurement of the concentration meter 33 falls within the above-mentioned range (i.e., 1.7 to 2.0 wt %).

When the concentration of aqueous hydrogen peroxide measured by the concentration meter 33 falls below the predetermined range [that is, when the concentration of aqueous hydrogen peroxide is a value less than 1.7 wt % (a first concentration value outside a predetermined range)], the feed amount of raw aqueous hydrogen peroxide (having a concentration of 30 wt %), which is necessary to be supplemented, is determined and the aqueous hydrogen peroxide in the determined amount is metered by the aqueous hydrogen peroxide metering tank 50. Thereafter, the valve 89 is opened and the aqueous hydrogen peroxide is fed from the metering tank 50 to the supply tank 30.

The supplementary feed amount of raw aqueous hydrogen peroxide is determined, based on the residual amount of abrasive liquid in the supply tank 30 and the concentration of aqueous hydrogen peroxide in the abrasive liquid in the supply tank 30. A method for this determination is explained below, referring to FIG. 2. FIG. 2 shows a table indicating the concentration of aqueous hydrogen peroxide in the abrasive liquid in the supply tank 30 and the rate of increase in the concentration of aqueous hydrogen peroxide after raw aqueous hydrogen peroxide (having a concentration of 30 wt %) is fed to the supply tank 30 in predetermined meter units. In FIG. 2, "1 meter unit" means 92.5 mL of raw aqueous hydrogen peroxide having a concentration of 30 wt % ["n meter units" means n times the above-mentioned amount (92.5 mL) of raw aqueous hydrogen peroxide]. That is, in FIG. 2, when the residual amount of abrasive liquid in the supply tank 30 is, for example, 30 L, and the concentration of aqueous hydrogen peroxide is 1.7 wt % at that time, by feeding raw aqueous hydrogen peroxide (having a concentration of 30 wt %) to the supply tank 30 in 2 meter units (185 mL), the concentration of aqueous hydrogen peroxide is increased to 1.888 wt % (a second concentration value within the predetermined range). In this case, the rate of increase in the concentration of aqueous hydrogen peroxide is 11.084%.

Based on the residual amount of abrasive liquid in the supply tank 30 and the concentration of aqueous hydrogen peroxide in the supply tank 30 as measured by the liquid level sensor 31 and the concentration meter 33, respectively, the control means 95 determines, from the data of FIG. 2, the number of meter units of raw aqueous hydrogen peroxide and feeds to the supply tank 30 the raw aqueous hydrogen peroxide in an amount corresponding to the determined number of meter units.

The number of meter units is determined so that the concentration of aqueous hydrogen peroxide in the supply tank 30 and the rate of increase in the concentration of hydrogen peroxide indicated in a thick-line frame in FIG. 2 can be obtained. That is, for example, when the residual amount of abrasive liquid in the supply tank 30 is 50 L and the concentration of aqueous hydrogen peroxide in the abrasive liquid in the supply tank 30 is 1.7 wt %, the number of meter units should be 4 or 5. Therefore, for example, an amount corresponding to 5 meter units (92.5 mL×5) is calculated as the feed amount of raw aqueous hydrogen peroxide. The thick-line frame indicates a range of the feed amount of raw aqueous hydrogen peroxide suitable for maintaining the concentration of aqueous hydrogen peroxide in the supply tank 30 within the above-mentioned predetermined range. That is, for example, when the residual amount of abrasive liquid is 50 L and the feed amount of raw aqueous hydrogen peroxide to be supplemented is 6 meter units, the concentration of aqueous hydrogen peroxide in the supply tank 30 exceeds 2.0 wt %. On the other hand, when the residual amount of abrasive liquid is 50 L and the feed amount of raw aqueous hydrogen peroxide is 3 meter units or less, although the concentration of aqueous hydrogen peroxide falls within the predetermined range, the rate of increase in the concentration of aqueous hydrogen peroxide in the supply tank 30 is not so high, so that the raw aqueous hydrogen peroxide must be supplemented again after a short period of time. Therefore, 4 or 5 meter units are included in the suitable feed amount range indicated by the thick-line frame.

By repeating the above-mentioned method, the concentration of aqueous hydrogen peroxide in the abrasive liquid in the supply tank 30 is maintained within the range of 1.7 to 2.0 wt %. Thus, an abrasive liquid having a concentration of aqueous hydrogen peroxide maintained under precise control can be fed to each polishing unit 40, thereby suppressing an adverse effect of a lowering of the concentration of aqueous hydrogen peroxide during the polishing operation.

As mentioned above, since the supplementary feed amount of raw aqueous hydrogen peroxide is small, feeding must be highly accurate. Therefore, it is necessary to read the residual amount of abrasive liquid in the supply tank 30 with high accuracy, while the feed amount of raw aqueous hydrogen peroxide must be precisely controlled. Therefore, in this embodiment, ultrasonic wave sensors are used as the liquid level sensors 31 and 51. With this arrangement, the distance between the liquid level sensor 31 or 51 and the liquid surface can be monitored with high accuracy by using the liquid level sensor 31 or 51 provided at an upper portion of each tank 30, 50. Therefore, accurate measurement of the residual amount of abrasive liquid and the feed amount of raw aqueous hydrogen peroxide can be ensured. If a liquid level sensor capable of conducting measurement at only one position on a side of the supply tank 30 is used as the liquid level sensor 31, a plurality of liquid level sensors 31 are required to be used for conducting accurate measurement of the residual amount of abrasive liquid. Therefore, in this embodiment of the present invention, an ultrasonic wave sensor is used as the liquid level sensor 31, so that accurate monitoring of the distance between the sensor and the liquid surface can be conducted by using a single sensor. The same reason applies to the use of the liquid level sensor 51.

FIG. 3 is a system diagram showing an abrasive liquid feed apparatus according to another embodiment of the present invention. In the abrasive liquid feed apparatus in this embodiment, differing from the embodiment of FIG. 1, the aqueous hydrogen peroxide feed pipe 65 is connected to the adjusting tank 20, instead of connecting the aqueous hydrogen peroxide feed pipe 65 to the supply tank 30. By this arrangement also, the object of the present invention can be achieved. That is, in this embodiment, a crude liquid and D.I. water in predetermined amounts are metered and mixed in the adjusting tank 20, and fed to the supply tank 30. When the concentration of aqueous hydrogen peroxide as measured by the concentration meter 33 falls below the predetermined range, the raw aqueous hydrogen peroxide in an amount determined by the control means 95 is metered by the aqueous hydrogen peroxide metering tank 50, passes through the adjusting tank 20 and is fed to the supply tank 30. That is, when the concentration meter 33 detects that the concentration of aqueous hydrogen peroxide has decreased to a value less than 1.7 wt %, as in the case of the above-mentioned embodiment, the supplementary feed amount of raw aqueous hydrogen peroxide is calculated in meter units by the control means 95 and the raw aqueous hydrogen peroxide in an amount corresponding to the calculated meter units is metered by the aqueous hydrogen peroxide metering tank 50. Thereafter, the valve 89 is opened and the raw aqueous hydrogen peroxide is fed from the aqueous hydrogen peroxide metering tank 50 to the adjusting tank 20, and fed to the supply tank 30 by opening the valve 83. It should be noted that metering of the raw aqueous hydrogen peroxide may be conducted by using the adjusting tank 20. In this case, the aqueous hydrogen peroxide metering tank 50 is omitted, and the adjusting tank 20 provides the additive feed means. Since the sensor 21 for measuring the amount of crude liquid or D.I. water is connected to the adjusting tank 20, metering of the raw aqueous hydrogen peroxide may be conducted by using this sensor 21, without connecting the liquid level sensor 51 to the adjusting tank 20.

In the above-mentioned embodiments, the aqueous hydrogen peroxide metering tank 50 is used as the additive feed means. However, instead of using the aqueous hydrogen peroxide metering tank 50, a flowmeter may be connected to the aqueous hydrogen peroxide feed line 66 so as to determine an integrated value. However, when aqueous hydrogen peroxide is used as the additive as in the case of the above-mentioned embodiments, use of a flowmeter causes bubbles to form and metering of the raw aqueous hydrogen peroxide is likely to become inaccurate. Therefore, the aqueous hydrogen peroxide metering tank 50 is preferably used as the additive feed means.

The embodiments of the present invention have been described above. However, the present invention is not limited to these embodiments. Various modifications can be made within the scope of the claims and the technical idea disclosed in the specification and drawings. Any forms, structures and materials which are not directly described in the specification and drawings are included in the technical idea of the present invention, as long as they exert the working effect of the present invention.

For example, although aqueous hydrogen peroxide (an oxidant) is used as the additive in the above-mentioned embodiments, the present invention can be applied to the feeding of an oxidant other than aqueous hydrogen peroxide, such as iron nitrate, or an additive other than an oxidant. Further, in the above-mentioned embodiments, the measurement of the concentration of aqueous hydrogen peroxide in the abrasive liquid in the supply tank 30 is conducted for every 10 L of the residual amount of abrasive liquid. However, the concentration of aqueous hydrogen peroxide may be continuously measured. Further, although the abrasive liquid is circulated through the supply tank 30 and the abrasive liquid pipe 67, the abrasive liquid may be disposable. Although a plurality of polishing units 40 are connected to the abrasive liquid pipe 67 in the above-mentioned embodiments, a single polishing unit may be used.

As has been described above, according to the present invention, the concentration of an additive in an abrasive liquid can be maintained accurately at a predetermined level and an adverse effect of a lowering of the concentration of additive in a polishing operation can be suppressed.

What is claimed is:

1. An abrasive liquid feed apparatus comprising:
   a supply tank for storing an abrasive liquid;
   an additive feed device which feeds an additive to the supply tank;
   an additive concentration measurement device which measures a concentration of the additive in the abrasive liquid in the supply tank; and
   a control which controls the concentration of the additive by feeding the additive by the additive feed device to the supply tank when the concentration of the additive measured by the additive concentration measurement device decreases to a first concentration value, to thereby increase the concentration of the additive to a second concentration value within a predetermined range.

2. The abrasive liquid feed apparatus according to claim 1, further comprising an abrasive liquid amount measurement device which measures an amount of the abrasive liquid in the supply tank, wherein the control calculates an amount of the additive to be fed to the supply tank, based on the concentration of the additive measured by the additive concentration measurement device and the amount of the abrasive liquid measured by the abrasive liquid amount measurement device.

3. The abrasive liquid feed apparatus according to claim 1, further comprising an abrasive liquid amount measurement device which measures an amount of the abrasive liquid in the supply tank, wherein the control is provided with a table in which a unit of amount of the additive to be fed to the supply tank is defined and there is presented a relationship between the amounts of the abrasive liquid in the supply tank measured by the abrasive liquid amount measurement device and numbers of the units of amount of the additive which are required to be fed to the supply tank to increase the first concentration value of the additive in the abrasive liquid in the supply tank to the second concentration value of the same, the control being adapted to control the concentration of the additive on the basis of the table.

4. The abrasive liquid feed apparatus according to claim 2, wherein the control is provided with a table in which a unit of amount of the additive to be fed to the supply tank is defined and there is presented a relationship between the amounts of the abrasive liquid in the supply tank measured by the abrasive liquid amount measurement device and numbers of the units of amount of the additive which are required to be fed to the supply tank to increase the first concentration value of the additive in the abrasive liquid in the supply tank to the second concentration value of the same, the control being adapted to control the concentration of the additive on the basis of the table.

5. A method for feeding an additive to an abrasive liquid feed apparatus, the abrasive liquid feed apparatus comprising a supply tank for storing an abrasive liquid, and an additive feed device which feeds an additive to the supply tank, the method comprising the steps of:

measuring a concentration of the additive in the abrasive liquid in the supply tank; and calculating an amount of the additive to be fed to the supply tank when the concentration of the additive in the abrasive liquid in the supply tank decreases to a first concentration value, and feeding the additive in the calculated amount to the supply tank, to thereby increase the concentration of the additive in the abrasive liquid in the supply tank to a second concentration value.

6. The method according to claim 5, wherein when the concentration of the additive in the abrasive liquid in the supply tank decreases to the first concentration value, the amount of the additive to be fed to the supply tank is calculated from an amount of the abrasive liquid in the supply tank and the concentration of the additive in the abrasive liquid in the supply tank.

7. The method according to claim 5, wherein a unit of amount of the additive to be fed to the supply tank is defined and the supply tank is fed with a necessary number of the units of the additive which number is determined on the basis of the calculation of the amount of the additive to be fed to the supply tank to increase the concentration of the additive to the second concentration value.

8. The method according to claim 6, wherein a unit of amount of the additive to be fed to the supply tank is defined and the supply tank is fed with a necessary number of the units of the additive which number is determined on the basis of the calculation of the amount of the additive to be fed to the supply tank to increase the concentration of the additive to the second concentration value.

9. A polishing apparatus comprising:

a polishing member having a polishing surface;

a holder for holding and pressing an object to be polished against the polishing member, while feeding an abrasive liquid to the polishing surface; and, an abrasive liquid feed apparatus for feeding the abrasive liquid according to claim 1.

10. A polishing apparatus comprising:

a polishing member having a polishing surface;

a holder for holding and pressing an object to be polished against the polishing member, while feeding an abrasive liquid to the polishing surface; and, an abrasive liquid feed apparatus for feeding the abrasive liquid according to claim 2.

11. A polishing apparatus comprising:

a polishing member having a polishing surface;

a holder for holding and pressing an object to be polished against the polishing member, while feeding an abrasive liquid to the polishing surface; and, an abrasive liquid feed apparatus for feeding the abrasive liquid according to claim 3.

12. A polishing apparatus comprising:

a polishing member having a polishing surface;

a holder for holding and pressing an object to be polished against the polishing member, while feeding an abrasive liquid to the polishing surface; and, an abrasive liquid feed apparatus for feeding the abrasive liquid according to claim 4.

* * * * *